(12) United States Patent
Itabashi

(10) Patent No.: US 6,353,228 B1
(45) Date of Patent: Mar. 5, 2002

(54) PHOTOSENSOR, AND RADIATION DETECTION APPARATUS AND SYSTEM

(75) Inventor: Satoshi Itabashi, Chigasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/321,718

(22) Filed: May 28, 1999

(30) Foreign Application Priority Data

Jun. 2, 1998 (JP) .......................................... 10-152964

(51) Int. Cl.[7] ................................................ G01T 1/24
(52) U.S. Cl. ................................................ 250/370.11
(58) Field of Search .................................. 250/370.11

(56) References Cited

U.S. PATENT DOCUMENTS 5,262,649 A    11/1993   Antonuk et al.

FOREIGN PATENT DOCUMENTS

| EP | 0 767 389 | 4/1997 |
|---|---|---|
| EP | 0 780 903 | 6/1997 |
| JP | 06-086175 | 3/1994 |
| JP | 07-030084 | 1/1995 |
| JP | 8-116044 | 5/1996 |
| JP | 10-084106 | 3/1998 |

*Primary Examiner*—Constantine Hannaher
*Assistant Examiner*—Andrew Israel
(74) *Attorney, Agent, or Firm*—Fitzpatrick, Cella, Harper & Scinto

(57) ABSTRACT

Conventionally, a metal which is opaque to light has been employed for the common electrode of the pixels of a photosensor. Consequently, a common electrode line has concealed the light receiving portions of photodiodes and has lowered the opening degree of these portions, thereby decreasing light outputs and degrading S/N (signal to noise) ratios. In view of this situation, a common electrode line to which one of a pair of electrodes of each of light receiving elements is connected is formed over signal lines for transferring the light signals of the light receiving elements.

30 Claims, 7 Drawing Sheets

FIG. 3I

PHOTOSENSOR, AND RADIATION DETECTION APPARATUS AND SYSTEM

BACKGROUND OF THE INVENTION

1. Field of the Invention

The present invention relates to a photosensor for detecting optical information, or a photosensor which is well suited to detect radiations, such as X-rays and γ-rays, directly or after converting the wavelength regions thereof into the photosensitive wavelength region such as that of visible light. It also relates to a radiation detection apparatus and system each of which is constructed by adopting the photosensor.

2. Related Background Art

Heretofore, a film has generally been used for observing a radiation transmission image in a radiation diagnosis. Besides, an image intensifier (hereinbelow, expressed as "I/I") has been used in order to observe a transmission image in real time during the irradiation of radiation. The I/I, however, has had the problems of a large size and a heavy weight.

Recently, a large-sized sensor employing amorphous silicon (hereinbelow, expressed as "a-Si") has been proposed as a detector which is smaller in size and lighter in weight and with which a transmission image can be observed in real time. This sensor has a construction wherein a photodiode being a light receiving element formed of the a-Si, and a thin film transistor (hereinbelow, abbreviated to "TFT") being a switching element are combined in one-to-one correspondence so as to form one pixel, and wherein the light receiving elements formed of the a-Si are arrayed in the shape of a two-dimensional matrix (see, for example, U.S. Pat. No. 5,262,649).

Although the above photodiode is of pin type, photodiodes include ones of pn type, Schottky type, etc. In addition, a photosensor of MIS type has been proposed by the inventors of the present invention (see the official gazette of Japanese Patent Application Laid-Open No. 8-116044). In this photosensor, a transparent electrode is disposed on an entrance side for light, and a wiring line Vce for the common electrode in the sensor is formed of metal. The common electrode line Vce is laid passing parts of the upper portions of the photodiodes, in parallel with signal lines Vsig which transfer light signals from the photodiodes to an amplifier via the switching TFTS.

Herein, the metal employed for the common electrode in the sensor is one which is opaque to light (for example, Al, Cr, W, Ta or Mo). In consequence, the common electrode line Vce conceals the light receiving portions of the photodiodes and lowers the opening degree of these portions, thereby to decrease light inputs to the light receiving areas of the photodiodes and to degrade the S/N (signal-to-noise) ratios of the light signals.

SUMMARY OF THE INVENTION

The present invention has its object to provide a photosensor in which, in spite of a large screen and a high definition, the opening degree of a light receiving portion can be held higher, thereby to increase a light input to this portion and to ensure a good S/N ratio.

Another object of the present invention is to provide a radiation detection apparatus and a radiation detection system each of which adopts the above photosensor, especially a two-dimensional photosensor in which light receiving elements are arrayed in two dimensions.

In one aspect of performance of the present invention, there is provided a photosensor having a plurality of pixels each of which includes a light receiving element and a switching element, a common electrode line to which one of a pair of electrodes of each of the light receiving elements is connected in common with each of the pixels, and signal lines to which light signals of the light receiving elements are transferred by simultaneously driving the switching elements of the pixels. A main wiring portion of said common electrode line is formed over said signal lines.

In another aspect of performance of the present invention, there is provided a radiation detection apparatus wherein a photosensor has a plurality of pixels each of which includes a light receiving element and a switching element, a common electrode line to which one of a pair of electrodes of each of the light receiving elements is connected in common with each of the pixels, and signal lines to which light signals of the light receiving elements are transferred by simultaneously driving the switching elements of the pixels. The photosensor is overlaid with wavelength conversion means for converting a wavelength region of radiation into a sensible wavelength region of the light receiving elements. A main wiring portion of the common electrode line is formed over the signal lines.

In a further aspect of performance of the present invention, there is provided a radiation detection system comprising a radiation detection apparatus including a photosensor having a plurality of pixels each of which includes a light receiving element and a switching element, a common electrode line to which one of a pair of electrodes of each of the light receiving elements is connected in common with each of the pixels, and signal lines to which light signals of the light receiving elements are transferred by simultaneously driving the switching elements of the pixels and over which a main wiring portion of the common electrode line is formed. The system also includes wavelength conversion means disposed over the photosensor, for converting a wavelength region of radiation into a sensible wavelength region of the light receiving elements, and image processing means for processing image information delivered for the radiation detection apparatus.

BRIEF DESCRIPTION OF THE DRAWINGS

FIGS. 3G, 3H and 3I are schematic views for explaining the steps of the process subsequent to the step of FIG. 3F, as to the part 2A—2A indicated in FIG. 1 (FIG. 3G shows the part 2A—2A in FIG. 1 at the same step as in FIG. 3F);

DESCRIPTION OF THE PREFERRED EMBODIMENTS

Figure 1:
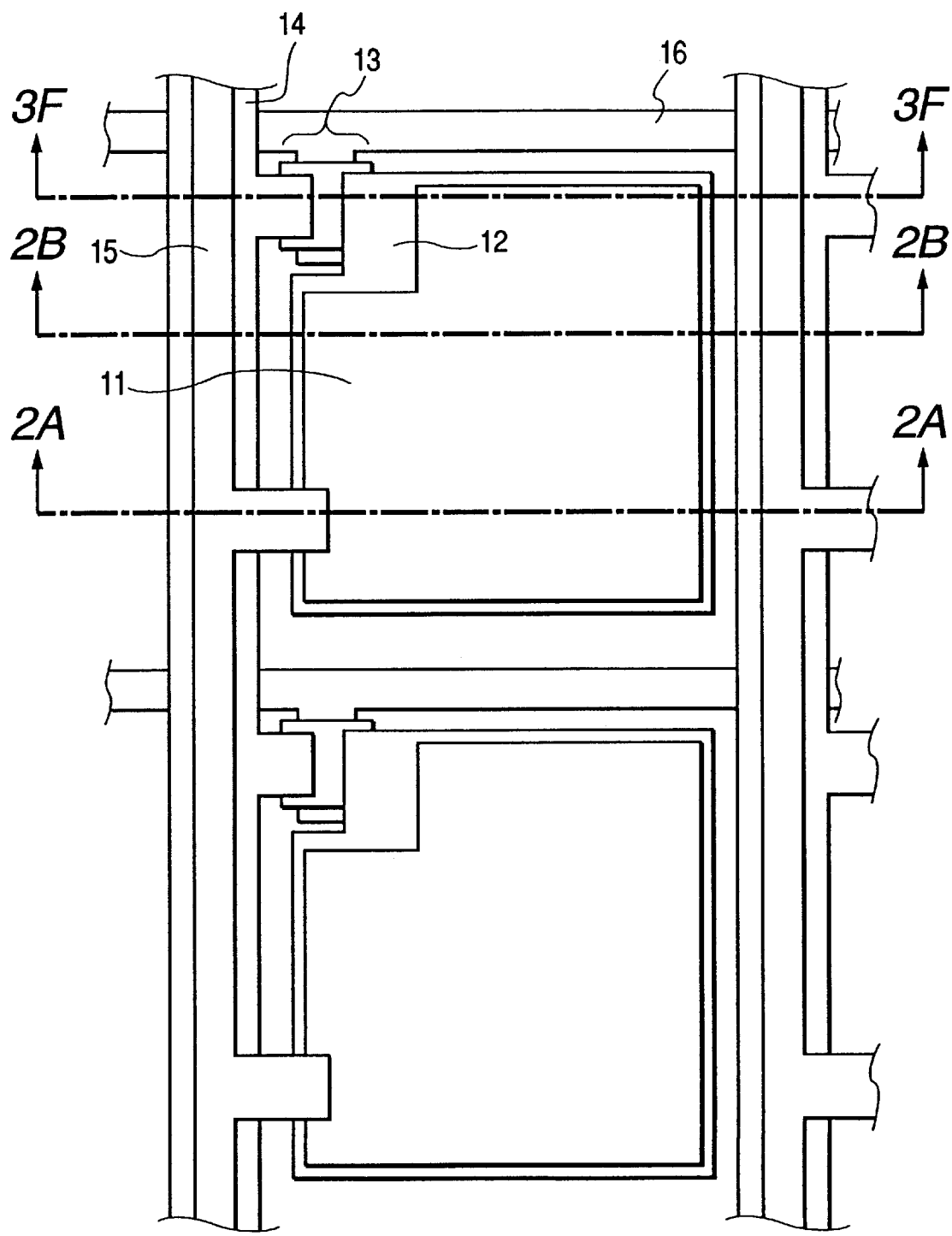
FIG. 1 is a schematic plan view showing the first aspect of performance of the present invention.
Figure 2A:
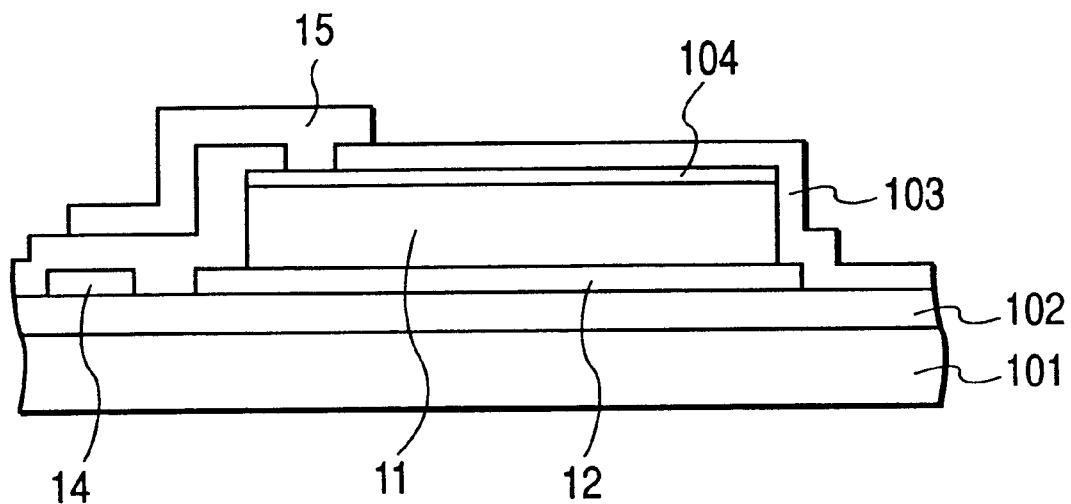
FIG. 2A is a schematic sectional view of part 2A—2A indicated in FIG. 1.

FIG. 1 is a schematic plan view showing the first aspect of performance of the present invention. FIG. 2A is a schematic sectional view of part 2A—2A indicated in FIG. 1, while FIG. 2B is a schematic sectional view of part 2B—2B indicated in FIG. 1.

Referring to FIG. 1, numeral 11 designates a photodiode, which is a photodiode of pin type, pn type or Schottky type (including MIS type) formed of a-Si. The photodiode 11 is formed on a drain electrode 12 of a TFT 13. The TFT 13 transfers to a signal line (Vsig line) 14 a light output which has been generated by the incidence of light on the photodiode 11. Shown with numeral 16 is a gate line for driving the TFT 13.

Figure 2B:
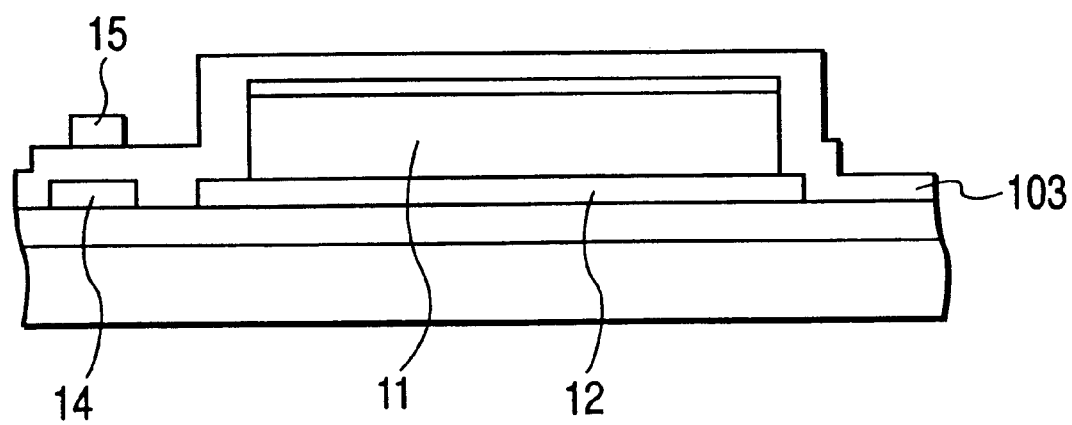
FIG. 2B is a schematic sectional view of part 2B—2B indicated in FIG. 1.

Referring to FIGS. 2A and 2B, the photodiode 11 has a predetermined bias potential applied thereto by a common electrode line (Vce line) 15 via a transparent electrode 104 disposed on the light entrance side of this photodiode and through an opening provided in an insulating protective film 103. As shown in FIG. 1 and FIGS. 2A and 2B, most of the part of the common electrode line (Vce line) 15 except the lugs thereof leading to the photodiodes 11 is formed over the signal lines (Vsig lines) 14. Accordingly, the wiring portion of the common electrode line (Vce line) 15 hardly shields the entrance portions of the photodiodes 11 from the light. As seen particularly from FIG. 2B, the wiring portion of the common electrode line 15 is formed within an extent overlying the signal lines 14, under the condition that it has a width equal to the width of the signal lines 14 or that at least one end face thereof has a width equal to or smaller than the width of the signal lines 14. Numerals 101 and 102 in FIG. 2A indicate a substrate and an insulator film, respectively.

FIGS. 3A to 3F are schematic views for explaining an example of the fabricating process of the photosensor of the present invention. The fabricating process will be described in conjunction with the section of part 3F—3F indicated in FIG. 1.

Figure 3A:
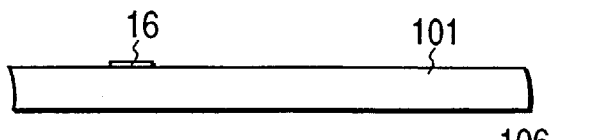
FIGS. 3A, 3B, 3C, 3D, 3E and 3F are schematic views for explaining an example of the fabricating process of the photosensor of the present invention, as to part 3F—3F indicated in FIG. 1.

As shown in FIG. 3A, the gate wiring line 16 of each TFT is formed on a glass substrate 101 (step A).

Figure 3B:
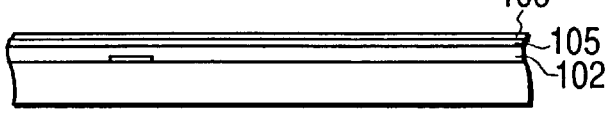

As shown in FIG. 3B, an insulator film 102, a semiconductor layer 105 and a channel protection film 106 are deposited on the resulting substrate (step B). The insulator film 102 is made of, for example, silicon nitride, and it becomes a gate insulator film. The channel protection film 106 is an insulator film made of, for example, silicon nitride.

Figure 3C:
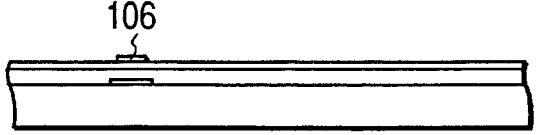

Thereafter, as shown in FIG. 3C, the channel protection film 106 is patterned so as to leave only the channel portion of each TFT behind (step C).

Figure 3D:
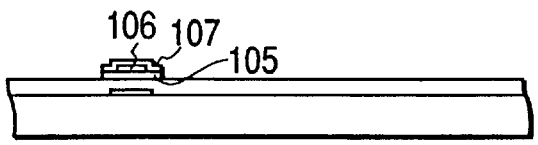

Subsequently, as shown in FIG. 3D, an ohmic contact layer 107 for the TFTs as is made of, for example, a-Si or microcrystalline silicon (expressed as "$\mu$c-Si") doped into the n+-type is deposited on the resulting structure, whereupon the ohmic contact layer 107 and the semiconductor layer 105 are patterned so as to be left behind only at each TFT part (step D).

Figure 3E:
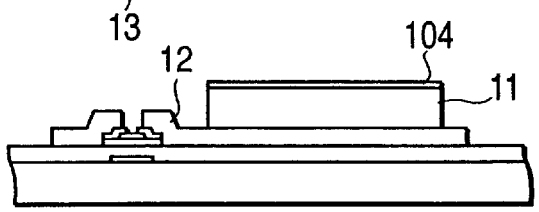

Further, as shown in FIG. 3E, a metal such as Al is deposited in a thickness of 1 $\mu$m by sputtering, and the deposited metal is patterned into the signal line (source electrode) 14 and drain electrode 12 of each TFT 13 (step E).

Figure 3F:
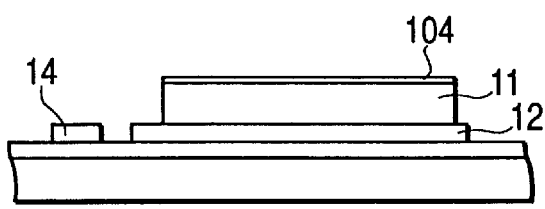

As shown in FIG. 3F, a p-layer, an i-layer and an n-layer of a-Si are stacked by deposition on the drain electrodes 12 of the TFTs in the above-mentioned order, a transparent film of ITO (indium tin oxide) or the like is formed on the deposited layers, and the film and the layers are patterned into each light receiving portion, whereby each photodiode 11 of pin type and each transparent electrode 104 are formed (step F). The stacking order of the types of the a-Si layers for forming each photodiode 11 may well be in the order of the n-layer, i-layer and p-layer reverse to the aforementioned order. Since, however, the diffusion length of a positive hole is greater than that of an electron, the efficiency of the sensor (namely, the light receiving portion) is bettered by locating the p-layer on the light entrance side of each photodiode 11.

Figure 3G:
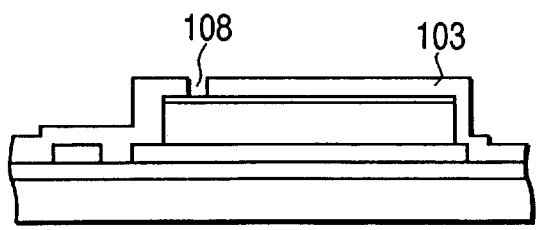

The above steps A thru F concern the section of the part 3F—3F indicated in FIG. 1. The same step as the step F is illustrated in FIG. 3G as to the section of the part 2A—2A indicated in FIG. 1. The ensuing description taken with reference to FIGS. 3G to 3I will concern the section of the part 2A—2A.

As shown in FIG. 3G, the photodiode 11 and the transparent electrode 104 have been formed on each drain electrode 12 in the section 2A—2A which does not include any TFT portion other than this drain electrode.

Figure 3H:
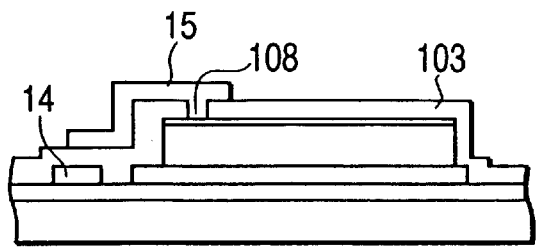

An insulating protective film 103 is deposited on the structure depicted in FIG. 3G, and each contact hole 108 for connecting the corresponding transparent electrode 104 to a common electrode line 15 is provided in the film 103 as shown in FIG. 3H.

A metal such as Al is deposited on the structure depicted in FIG. 3H. Then, as shown in FIG. 3I, the deposited metal is connected with each transparent electrode 104 through the corresponding contact hole 108 provided in the insulating protective film 103. Further, the deposited metal is patterned to lay the common electrode line 15 so that the wiring portion thereof necessary for connection with a power source may be arranged over the signal lines 14. In particular, except the lugs of the common electrode line 15 leading to the sensors (namely, the light receiving portions), this line is formed over the signal lines 14 so as to have a width smaller than or equal to the width of the lines 14. Thus, the main wiring portion of the common electrode line 15 comes to overlie the signal lines 14.

In this way, most of the part of the common electrode line 15 can be formed on the signal lines 14, thereby to readily enhance the space factor of the photosensor and the opening degree of the light receiving portions.

Next, the second aspect of performance of the present invention will be described with reference to FIGS. 4 and 5.

Figure 4:
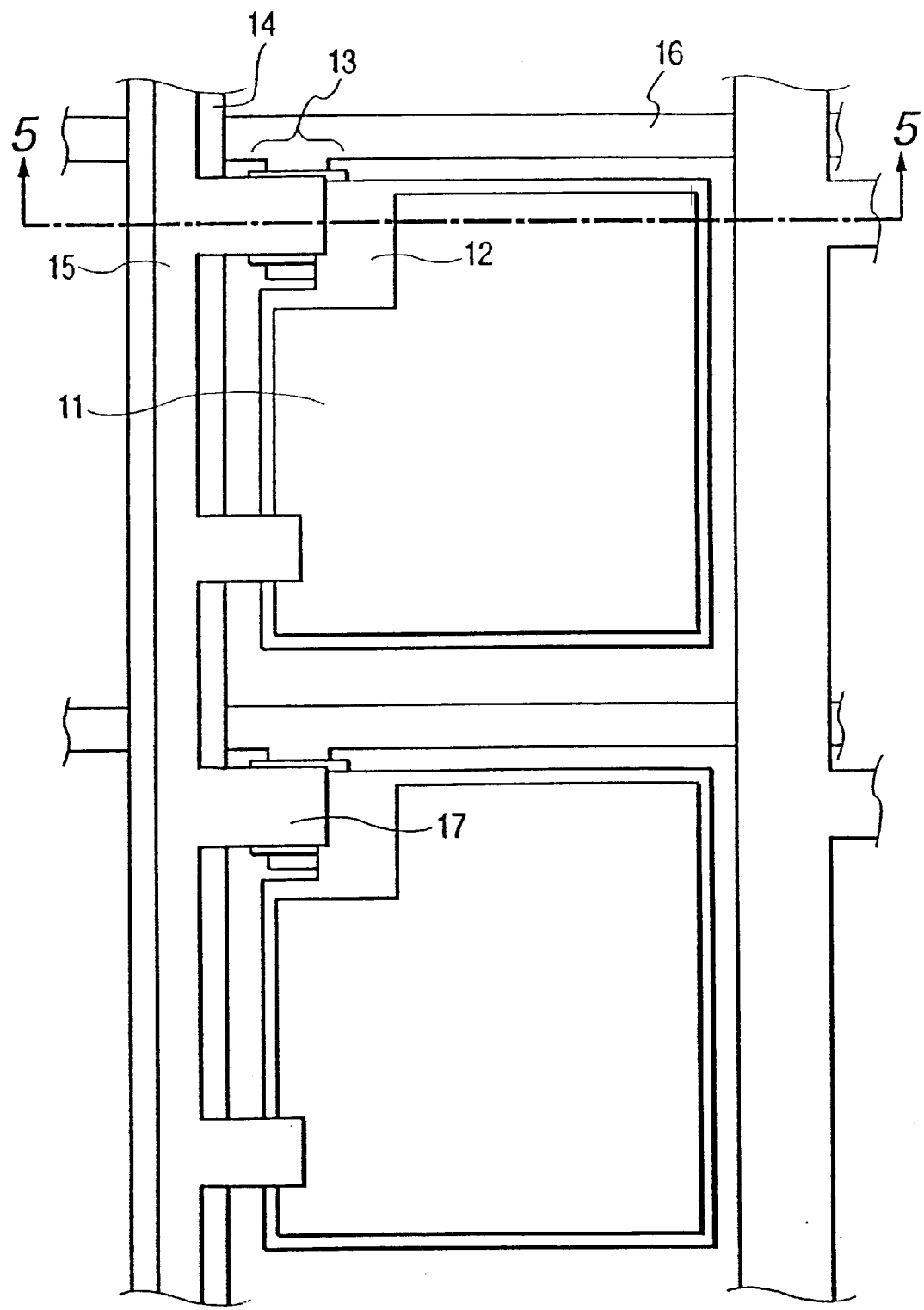
FIG. 4 is a schematic plan view showing the second aspect of performance of the present invention.

In the embodiment shown in FIG. 4, a common electrode line 15 protrudes only over TFTs 13. Over each TFT 13 over which the common electrode line 15 extends, a light shield 17 is formed by the extension of the common electrode line 15 so as to conceal the channel portion of the TFT 13. Thus, the channel portion of the TFT 13 is shielded from light which otherwise enters this channel portion from above.

Figure 5:
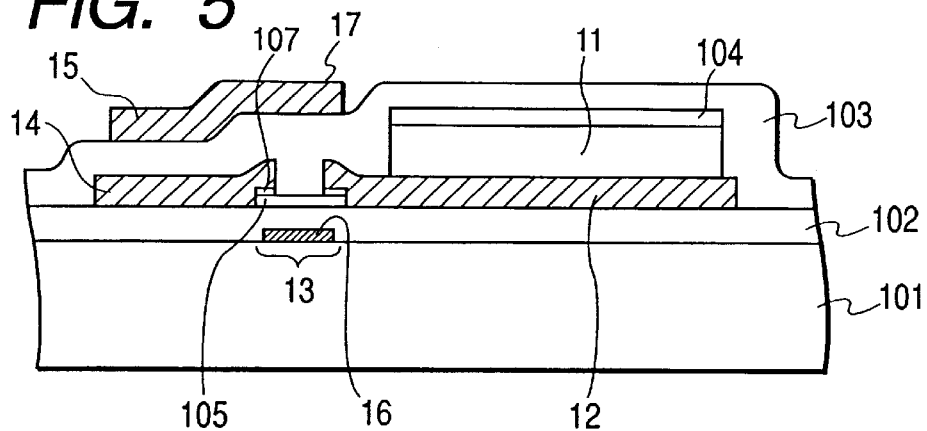
FIG. 5 is a schematic sectional view of part 5—5 indicated in FIG. 4.

FIG. 5 is a schematic sectional view taken along plane 5—5 indicated in FIG. 4.

With the embodiment shown in FIGS. 4 and 5, a predetermined potential is usually applied to the common electrode line 15 extended over the TFTs 13. If necessary, therefore, the common electrode line 15 can be operated as a bias electrode for further lowering a leakage current at the turn-OFF of each TFT or for further increasing the response rate of each TFT. Such an operation depends also upon the thickness of an insulating protective layer 103 and the sign and magnitude of the applied voltage.

Incidentally, the TFT 13 shown in FIG. 5 is of so-called "channel etch type", in which an ohmic contact layer 107 in the channel portion of the TFT is removed after the metal electrodes (source and drain electrodes) of the TFT have been formed without providing a channel protection layer. In this case, also a semiconductor layer 105 is somewhat over-etched, but a mask for providing the channel protection layer is dispensed with to bring forth the advantage of a simpler fabricating process.

Figure 6A:
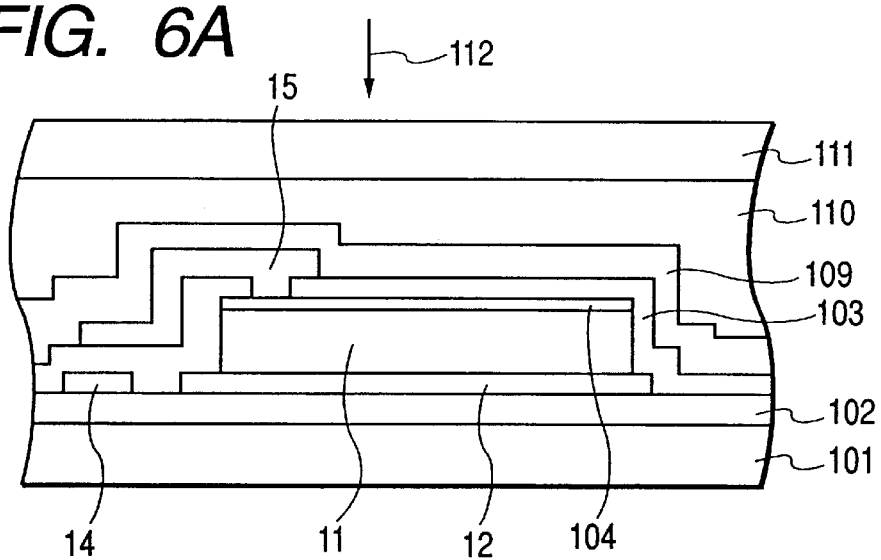
FIGS. 6A and 6B are sectional views schematically showing an example of a constructed in which the sensor constructed in the first aspect of performance of the present invention is applied to a radiation detection apparatus, as to the parts 2A—2A and 2B—2B indicated in FIG. 1, respectively.
Figure 6B:
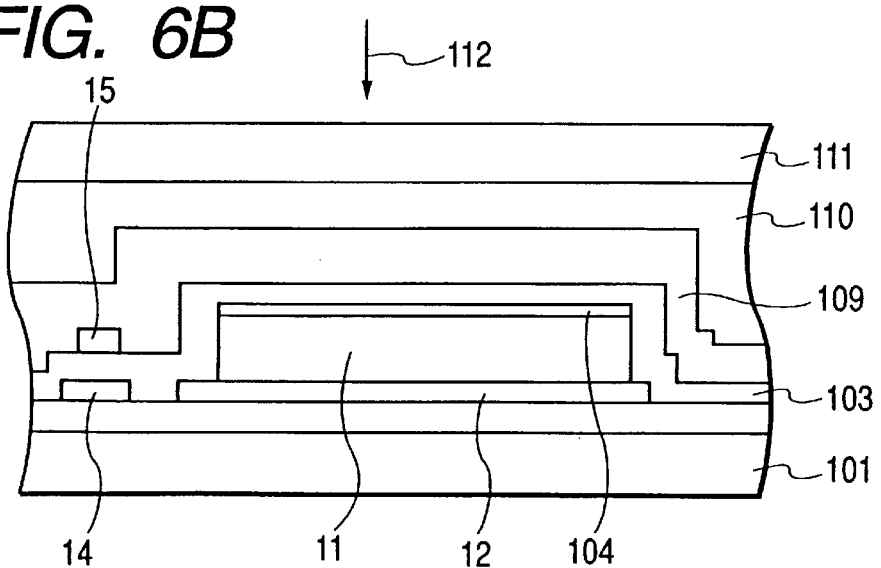

An example of construction in which the photosensor constructed in the foregoing first aspect of performance is applied to a radiation detection apparatus, will now be described with reference to schematic sectional views depicted in FIGS. 6A and 6B. Sections shown in FIGS. 6A and 6B correspond to the planes 2A—2A and 2B—2B indicated in FIG. 1, respectively.

In the photosensor adopted here, a second insulator film 109 made of silicon nitride for protecting the sensor portions (light receiving portions) has been further disposed after the formation of the TFTs, photodiodes and wiring portion. When the second insulator film 109 is formed as an inorganic film in this manner, water and moisture can be perfectly prevented from intruding into the semiconductor elements such as TFTs and photodiodes, and the wiring lines. A scintillator 111 which serves as a wavelength converter is stuck on the second insulator film 109 by the use of a binder layer 110 of epoxy resin, silicone resin or the like. Usable for the scintillator 111 is a rare-earth-based phosphor, CsI, CsI(Tl) or the like. The scintillator 111 converts X-rays 112 into visible light having a wavelength to which the sensor portions of a-Si are highly sensitive. Of course, the scintillator 111 should preferably be furnished with a protective member, such as thin aluminum film, capable of transmitting the X-rays 112 and serving to protect the phosphor or the like from moisture and mechanical damages.

Figure 7:
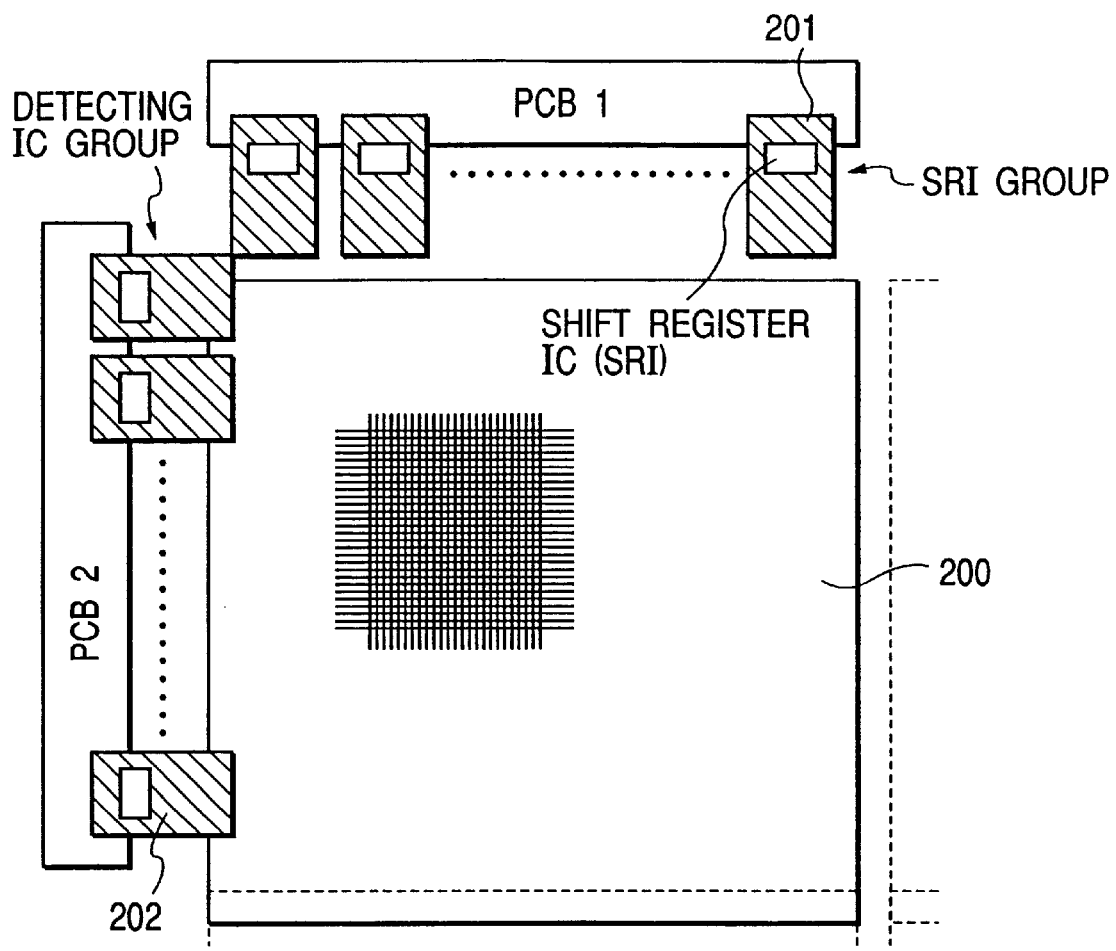
FIG. 7 and FIG. 8 are a schematic arrangement view and a schematic sectional view in the case of applying the sensor of the present invention to a radiation detection apparatus, for example, an X-ray detection apparatus, respectively.
Figure 8:
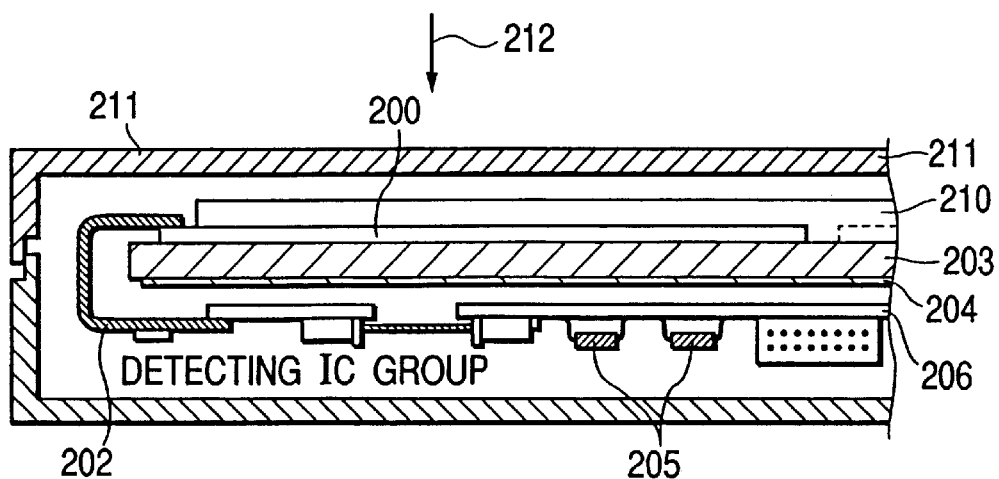

FIG. 7 and FIG. 8 show a schematic arrangement view and a schematic sectional view in the case where the photosensor of the present invention is applied to a radiation detection apparatus, for example, an X-ray detection apparatus, respectively. Referring to FIG. 7, a plurality of light receiving pixels each including an a-Si photodiode and an a-Si TFT are formed in a matrix shape within an a-Si sensor substrate 200. First flexible circuit boards 201 on each of which a shift register IC (SRI) is mounted are connected on the surface of an edge of the a-Si sensor substrate 200, while second flexible circuit boards 202 on each of which a detecting IC for amplifying and detecting the light signals of the sensor pixels is mounted are connected on the surface of another edge orthogonal to the first-mentioned edge. Besides, printed circuit boards PCB1 and PCB2 are respectively connected on the sides of the first and second flexible circuit boards (201 and 202) remote from the sensor substrate 200.

Referring to FIG. 8, a plurality of (for example, four) a-Si sensor substrates 200 explained above are stuck on a base 203, thereby to construct a large-sized two-dimensional photosensor. A lead plate 204 for protecting electric circuits or ICs, such as the memories 205 of a processing circuit 206, from X-rays 212 is mounted on the side of the base 203 remote from the incidence side of the photosensor for the X-rays 212. Further, each flexible circuit board is bent into the shape of letter U, whereby the correspondent detecting IC 202 is arranged so as to be shaded by the protecting lead 204 against the incident X-rays 212. A scintillator of, for example, CsI(Tl) 210 for converting the X-rays 212 into visible light is stuck on the a-Si sensor substrates 200, or it is formed directly on the surfaces of the a-Si sensor substrates 200.

The X-ray detection apparatus thus constructed can detect the dose or quantity of the X-rays 212 by detecting the quantity of the light into which the X-rays 212 have been converted by the same principle as in the foregoing.

In the embodiment shown in FIGS. 7 and 8, the whole structure including the sensor substrates and the electric circuits is held in a case 211 made of carbon fiber.

Figure 9:
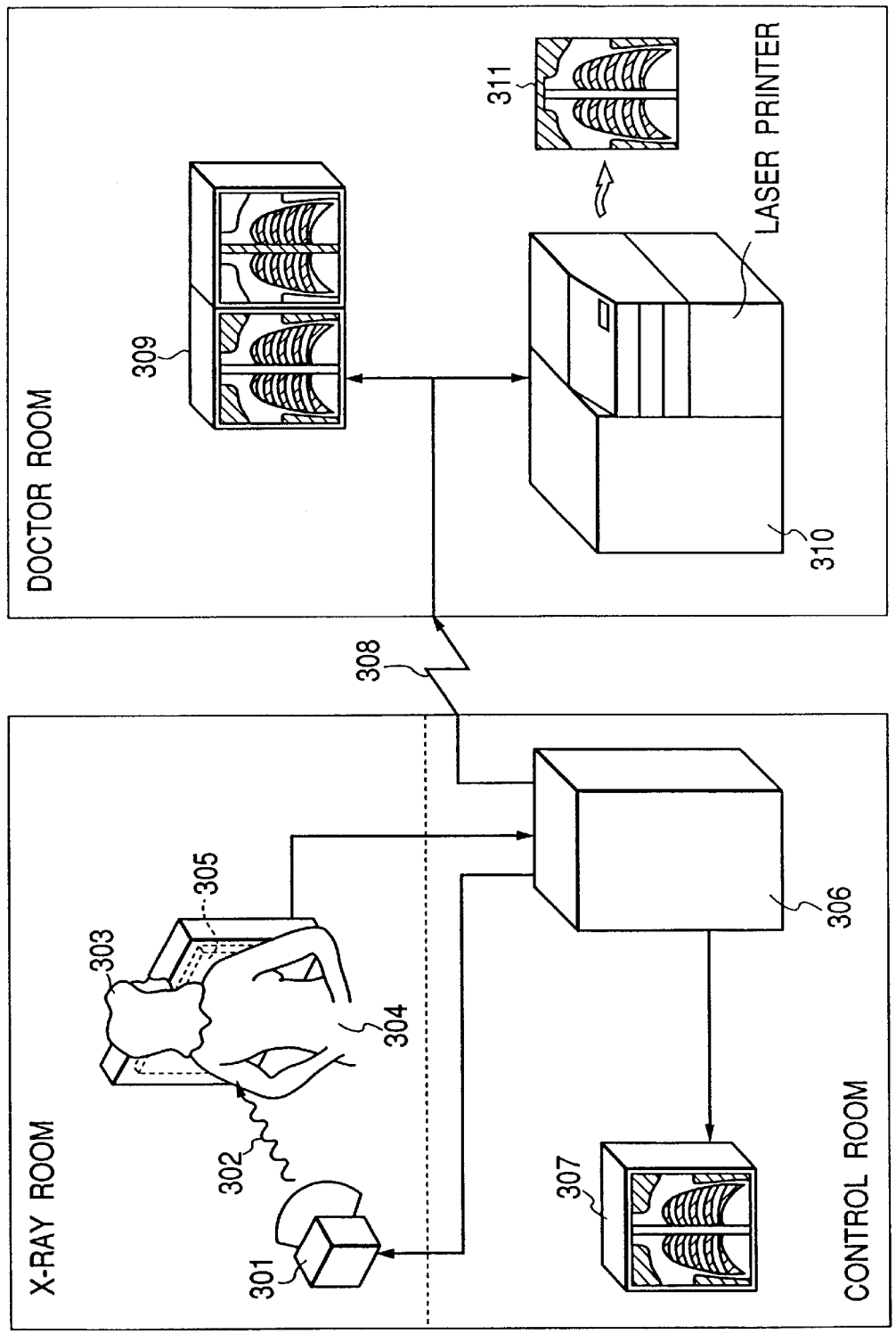
FIG. 9 illustrates an example of application of the two-dimensional photosensor of the present invention to a radiation inspection system.

FIG. 9 illustrates an example of the application of the two-dimensional photosensor of the present invention to a radiation inspection system.

X-rays 302 generated by an X-ray tube 301 are transmitted through the breast 304 of a patient or subject 303, and are entered into a photoelectric conversion apparatus (image sensor) 305 including a screen of phosphor arranged thereon. Information on the interior of the body of the patient 303 is contained in the image of the entered X-rays. The phosphor phosphoresces in correspondence with the entrance of the X-rays 302, and the resulting phosphorescence is photoelectrically converted to obtain electrical information. The electrical information is digitized and is subsequently processed by an image processor 306 into an image, which can be observed on a display device 307 installed in a control room.

Moreover, the image information can be transmitted to a remote site by transmission (communication) means such as a telephone line 308. In a doctor's room or the like in a place separate from the X-ray room or the control room, the transmitted information can be displayed on a display device 309, in reverse fashion if necessary, or it can be saved and stored in saving means such as an optical disk. It is thus possible to utilize the radiation inspection system for diagnosis by a doctor in the remote site. Furthermore, the transmitted information can be recorded on a film 311 (or paper) by using a laser printer included in a film processor 310 which serves also as save means. Of course, it is also possible that the patient 303 maybe replaced with any structure or article, with the breast 304 being replaced with the part of the structure or article desired to be examined. In this case, the radiation inspection system can be utilized for the inspection of an internal construction or internal contents.

As described above, according to the present invention, the open areas of light receiving elements can be enlarged to produce greater sensor outputs. It is therefore possible to provide a two-dimensional photosensor with high S/N ratio and a radiation detection apparatus as well as a radiation inspection system adopting the photosensor. Further, a pixel size required for a sensor output can be reduced by enlarging the open area. It is therefore possible to provide a two-dimensional photosensor of high definition and a radiation detection apparatus as well as a radiation inspection system adopting the photosensor.

Besides, in the present invention, a leakage current at the turn-OFF of each TFT can be diminished by employing a common electrode line in order to shield TFTs from light. It is accordingly possible to provide a two-dimensional photosensor of still higher S/N ratio and stabler characteristics, and a radiation detection apparatus as well as a radiation inspection system adopting the photosensor.

What is claimed is:

1. A photosensor comprising a plurality of pixels each of which includes a light receiving element and a switching element, a common electrode line to which one of a pair of electrodes of each of said light receiving elements is connected in common with each of said pixels, and signal lines to which light signals of said light receiving elements are transferred by simultaneously driving said switching elements of said pixels;

wherein a main wiring portion of said common electrode line overlaps with a main wiring portion of said signal lines.

2. A photosensor as defined in claim 1, wherein a main part of at least one end face of said wiring portion of said common electrode line has a width equal to or smaller than a width of an end face of each signal line.

3. A photosensor as defined in claim 1, wherein said common electrode line conceals channel portions of said switching elements by its parts corresponding to said switching elements.

4. A photosensor as defined in claim 1, wherein said pixels are arrayed in a matrix, and a plurality of said pixels, associated with at least one of rows and columns of the matrix, can be simultaneously driven.

5. A photosensor as defined in claim 1, wherein said light receiving elements include photodiodes.

6. A photosensor as defined in claim 1, wherein said switching elements include thin film transistors.

7. A radiation detection apparatus wherein a photosensor has a plurality of pixels each of which includes a light receiving element and a switching element, a common electrode line to which one of a pair of electrodes of each of said light receiving elements is connected in common with each of said pixels, and signal lines to which light signals of said light receiving elements are transferred by simultaneously driving said switching elements of said pixels, and wherein said photosensor is overlaid with wavelength conversion means for converting a wavelength region of radiation into a sensible wavelength region of said light receiving elements;

wherein a main wiring portion of said common electrode line overlaps with a main wiring portion of said signal lines.

8. A radiation detection apparatus as defined in claim 7, wherein a main part of at least one end face of said wiring portion of said common electrode line has a width equal to or smaller than a width of an end face of each signal line.

9. A radiation detection apparatus as defined in claim 7, wherein said common electrode line conceals channel portions of said switching elements by its parts corresponding to said switching elements.

10. A radiation detection apparatus as defined in claim 7, wherein said pixels are arrayed in a matrix, and a plurality of said pixels, associated with at least one of rows and columns of the matrix, can be simultaneously driven.

11. A radiation detection apparatus as defined in claim 7, wherein said light receiving elements include photodiodes.

12. A radiation detection apparatus as defined in claim 7, wherein said switching elements include thin film transistors.

13. A radiation detection apparatus as defined in claim 7, wherein said light receiving elements can sense a wavelength region of visible light.

14. A radiation detection apparatus as defined in claim 7, wherein said wavelength conversion means includes a scintillator.

15. A radiation detection apparatus as defined in claim 7, wherein said wavelength conversion means contains a phosphor.

16. A radiation detection apparatus as defined in claim 7, wherein said wavelength conversion means contains CsI.

17. A radiation detection system comprising:

a radiation detection apparatus including:

a photosensor having a plurality of pixels each of which includes a light receiving element and a switching element, a common electrode line to which one of a pair of electrodes of each of said light receiving elements is connected in common with each of said pixels, and signal lines to which light signals of said light receiving elements are transferred by simultaneously driving said switching elements of said pixels, wherein a main wiring portion of said common electrode line overlaps with a main wiring portion of said signal lines; and wavelength conversion means disposed over said photosensor, for converting a wavelength region of radiation into a sensible wavelength region of said light receiving elements; and image processing means for processing image information delivered from said radiation detection apparatus.

18. A radiation detection system as defined in claim 17, wherein a main part of at least one end face of said wiring portion of said common electrode line has a width equal to or smaller than a width of an end face of each signal line.

19. A radiation detection system as defined in claim 17, wherein said common electrode line conceals channel portions of said switching elements by its parts corresponding to said switching elements.

20. A radiation detection system as defined in claim 17, wherein said pixels are arrayed in a matrix, and a plurality of said pixels, associated with at least one of rows and columns of the matrix, can be simultaneously driven.

21. A radiation detection system as defined in claim 17, wherein said light receiving elements include photodiodes.

22. A radiation detection system as defined in claim 17, wherein said switching elements include thin film transistors.

23. A radiation detection system as defined in claim 17, wherein said light receiving elements can sense a wavelength region of visible light.

24. A radiation detection system as defined in claim 17, wherein said wavelength conversion means includes a scintillator.

25. A radiation detection system as defined in claim 17, wherein said wavelength conversion means contains a phosphor.

26. A radiation detection system as defined in claim 17, wherein said wavelength conversion means contains CsI.

27. A radiation detection system as defined in claim 17, further comprising image output means for performing an image output based on image signals delivered from said image processing means.

28. A radiation detection system as defined in claim 27, wherein said image output means is selected from the group consisting of a display device and a laser printer.

29. A radiation detection system as defined in claim 17, wherein said image processing means is further connected to transmission means.

30. A radiation detection system as defined in claim 17, wherein said image processing means is further connected to saving means for storing the image information therein.

* * * * *